United States Patent
Nozu et al.

(10) Patent No.: US 9,530,801 B2
(45) Date of Patent: Dec. 27, 2016

(54) DISPLAY CIRCUITRY WITH IMPROVED TRANSMITTANCE AND REDUCED COUPLING CAPACITANCE

(71) Applicant: Apple Inc., Cupertino, CA (US)

(72) Inventors: Daisuke Nozu, Saitama (JP); Hirokazu Yamagata, Adachi (JP); Hiroshi Osawa, Sunnyvale, CA (US); Shang-Chih Lin, Los Altos, CA (US); Shih-Chang Chang, Cupertino, CA (US); Yu-Cheng Chen, San Jose, CA (US)

(73) Assignee: Apple Inc., Cupertino, CA (US)

( * ) Notice: Subject to any disclaimer, the term of this patent is extended or adjusted under 35 U.S.C. 154(b) by 153 days.

(21) Appl. No.: 14/153,954

(22) Filed: Jan. 13, 2014

(65) Prior Publication Data
US 2015/0200207 A1 Jul. 16, 2015

(51) Int. Cl.
*G02F 1/1368* (2006.01)
*H01L 27/12* (2006.01)
(Continued)

(52) U.S. Cl.
CPC ........... *H01L 27/124* (2013.01); *G02F 1/1368* (2013.01); *G02F 1/133502* (2013.01);
(Continued)

(58) Field of Classification Search
CPC .............. G02F 1/13345; G02F 2202/42; G02F 2001/13685; H01L 27/3244
See application file for complete search history.

(56) References Cited

U.S. PATENT DOCUMENTS 6,313,481 B1* 11/2001 Ohtani et al. .................... 257/59
6,531,713 B1*  3/2003 Yamazaki ........... G02F 1/13454
                                                          257/350
(Continued)

OTHER PUBLICATIONS

A. Sassella, A. Borghesi, S. Rojas, L. Zanotti. "Optical Properties of CVD-Deposited Dielectric Films for Microelectronic Devices." Journal de Physique IV, 1995, 05 (C5), pp. C5-843-C5-859.*

*Primary Examiner* — Allen Parker
*Assistant Examiner* — Stephen Bradley
(74) *Attorney, Agent, or Firm* — Treyz Law Group, P.C.; Jason Tsai

(57) ABSTRACT

A display may have a color filter layer and a thin-film transistor layer. A layer of liquid crystal material may be located between the color filter layer and the thin-film transistor (TFT) layer. The TFT layer may include thin-film transistors formed on top of a glass substrate. A passivation layer may be formed on the thin-film transistor layers. A first low-k dielectric layer may be formed on the passivation layer. Data line routing structures may be formed on the first low-k dielectric layer. A second low-k dielectric layer may be formed on the first low-k dielectric layer. A common voltage electrode and associated storage capacitance may be formed on the second low-k dielectric layer. The first and second low-k dielectric layers may be formed from material having substantially similar refractive indices to maximize backlight transmittance and may have appropriate thicknesses so as to minimize parasitic capacitive loading.

18 Claims, 9 Drawing Sheets

(51) Int. Cl.
  *G02F 1/1335* (2006.01)
  *G02F 1/1362* (2006.01)
  *G02F 1/1333* (2006.01)
  *G02F 1/136* (2006.01)

(52) U.S. Cl.
  CPC .. *G02F 1/136213* (2013.01); *G02F 1/136227* (2013.01); *H01L 27/1255* (2013.01); *H01L 27/1259* (2013.01); *G02F 1/133345* (2013.01); *G02F 2001/13606* (2013.01); *G02F 2001/13685* (2013.01); *G02F 2201/40* (2013.01); *G02F 2202/42* (2013.01)

(56) References Cited

U.S. PATENT DOCUMENTS

| | | | |
|---|---|---|---|
| 7,211,898 B2 | 5/2007 | Lee et al. | |
| 8,012,794 B2 | 9/2011 | Ye | |
| 8,101,949 B2 | 1/2012 | Ye | |
| 8,143,093 B2 | 3/2012 | Ye | |
| 8,258,511 B2 | 9/2012 | Ye | |
| 8,294,863 B2 * | 10/2012 | Ninomiya | G02F 1/136227 349/138 |
| 8,344,374 B2 | 1/2013 | Yamazaki et al. | |
| 8,349,669 B2 | 1/2013 | Ye | |
| 8,421,083 B2 | 4/2013 | Yamazaki et al. | |
| 8,435,843 B2 | 5/2013 | Ye | |
| 8,617,946 B2 | 12/2013 | Liu et al. | |
| 8,617,986 B2 | 12/2013 | Liang et al. | |
| 2002/0113927 A1 * | 8/2002 | Ha et al. | 349/113 |
| 2004/0021805 A1 | 2/2004 | Nagata et al. | |
| 2004/0201800 A1 | 10/2004 | Jin et al. | |
| 2005/0133837 A1 | 6/2005 | Hsu et al. | |
| 2007/0097303 A1 * | 5/2007 | Sonoda | G02F 1/133345 349/122 |
| 2007/0216280 A1 * | 9/2007 | Hara | H01L 27/3244 313/463 |
| 2009/0005699 A1 | 1/2009 | Sakurai et al. | |
| 2011/0253998 A1 | 10/2011 | Theiss et al. | |
| 2012/0274542 A1 * | 11/2012 | Yamazaki et al. | 345/32 |
| 2013/0043476 A1 * | 2/2013 | Sung et al. | 257/59 |
| 2014/0239270 A1 * | 8/2014 | Ko | H01L 27/1255 257/40 |

* cited by examiner

DISPLAY CIRCUITRY WITH IMPROVED TRANSMITTANCE AND REDUCED COUPLING CAPACITANCE

BACKGROUND

This relates generally to electronic devices, and more particularly, to electronic devices with displays.

Electronic devices often include displays. For example, cellular telephones and portable computers often include displays for presenting information to a user.

Liquid crystal displays contain a layer of liquid crystal material. Display pixels in a liquid crystal display contain thin-film transistors and electrodes for applying electric fields to the liquid crystal material. The strength of the electric field in a display pixel controls the polarization state of the liquid crystal material and thereby adjusts the brightness of the display pixel.

In a conventional liquid crystal display, the display pixel thin-film transistors are formed on a glass substrate. For example, gate and source-drain structures for each display pixel thin-film transistor can be formed over the glass substrate. The gate structure of each display pixel thin-film transistor is coupled to a gate line that carries signals to selectively turn on the thin-film transistors, whereas one of the source-drain structures of each display pixel thin-film transistor is coupled to a data line that carries image/video signals to be written into each display pixel.

A silicon nitride passivation layer is then formed on the thin-film transistors. A layer of silicon oxide is formed on the silicon nitride layer. Data line metal routing structures are often formed on the layer of silicon oxide. An acrylic organic planarization layer is then formed on the silicon oxide. The silicon oxide layer and the acrylic organic planarization layer generally exhibit different indices of refraction.

During operation of the liquid crystal display, backlight is used to illuminate the display pixels. Due to the difference in the refractive index of the silicon oxide layer and the refractive index of the acrylic organic planarization layer, a substantial portion of the backlight may be reflected back into the display, which reduces the transmittance and efficiency of the liquid crystal display. Moreover, the silicon oxide layer needs to be relatively thin to reduce silicon oxide film stress, which can cause breakage of the glass substrate. As a result, it is also challenging to reduce any parasitic capacitance that exists between the thin-film transistor gate structures and the data line metal routing structures. Data line capacitive loading can significantly degrade the display performance and consume excessive power.

It would therefore be desirable to be able to provide electronic displays with improved transmittance and reduced data line loading.

SUMMARY

An electronic device having a liquid crystal display is provided. The liquid crystal display may include display pixel circuitry formed on a glass substrate. Thin-film transistor structures may be formed on the glass substrate. A passivation layer may be formed on the thin-film transistor structures (e.g., a silicon nitride passivation liner may be formed directly on top of the gate conductor of a thin-film transistor).

A first low-k dielectric layer may be formed on the passivation layer. A second low-k dielectric layer may be formed on the first low-k dielectric layer. The first and second low-k dielectric layers may exhibit dielectric constants that are less than that of silicon dioxide and may exhibit substantially similar indices of refraction (e.g., indices of refraction that differ by no more than 0.05). If desired, the first and second low-k dielectric layers may be formed from the same material. In some arrangements, the first and second low-k dielectric layers may be formed from organic acrylic, photoresist or other light-sensitive material, etch-resistant material, siloxane-based polymer, silicon-based dielectric, a combination of these materials, and/or an suitable low-k dielectric materials.

First and second thin-film transistor source-drain contact vias may be formed through the first low-k dielectric layer. The first source-drain contact via may be coupled to a corresponding data line on which analog image signals are provided during normal display operation. The second source-dram contact via may be coupled to a storage capacitor. The storage capacitor may be formed from a pixel electrode and a common electrode (Vcom). The pixel electrode may be coupled to the second source-drain contact via. If desired, the pixel electrode may be configured to make contact with the second source-drain contact via at a pixel contact location positioned directly over the gate conductor of the thin-film transistor to improve aperture ratio.

Further features of the present invention, its nature and various advantages will be more apparent from the accompanying drawings and the following detailed description.

DETAILED DESCRIPTION

Electronic devices may include displays. The displays may be used to display images to a user. Illustrative electronic devices that may be provided with displays are shown in FIGS. 1, 2, 3, and 4.

Figure 1:
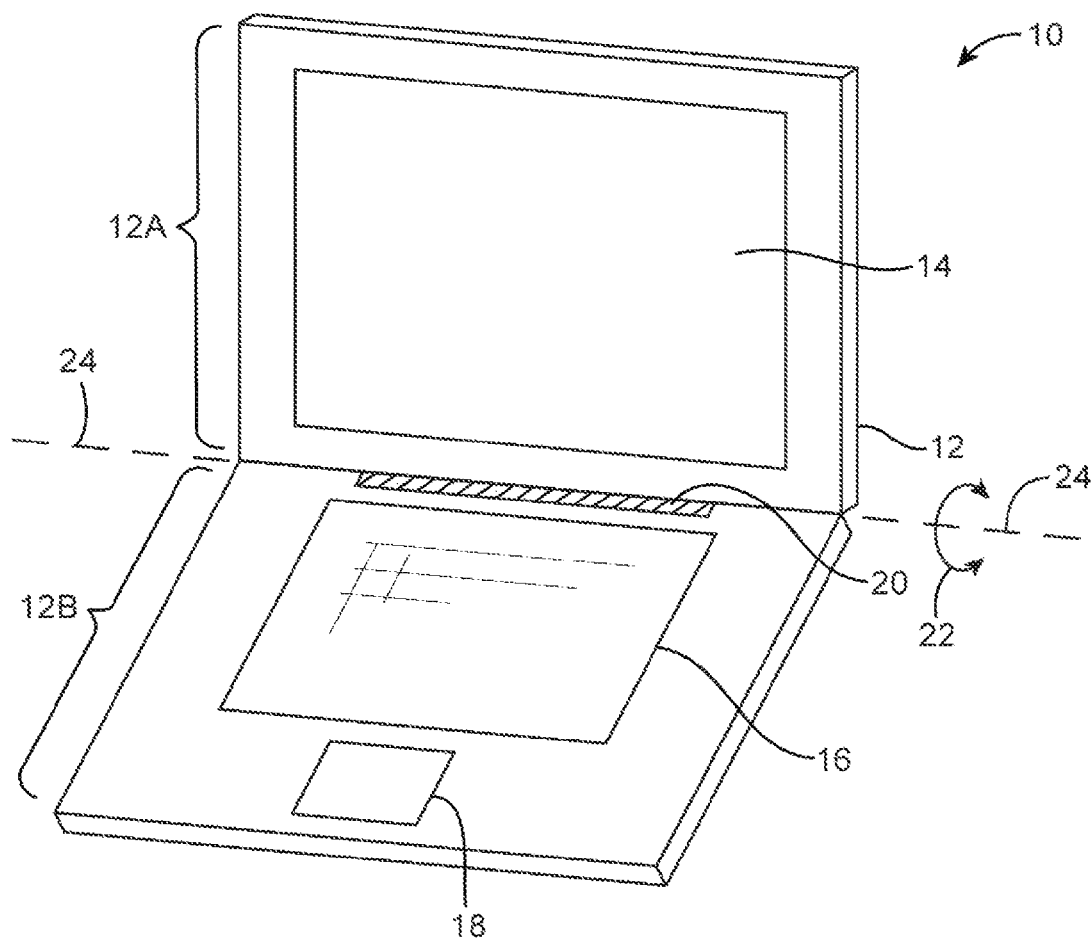
FIG. 1 is a perspective view of an illustrative electronic device such as a laptop computer with a display in accordance with an embodiment of the present invention.

FIG. 1 shows how electronic device 10 may have the shape of a laptop computer having upper housing 12A and lower housing 12B with components such as keyboard 16 and touchpad 18. Device 10 may have lunge structures 20 that allow upper housing 12A to rotate in directions 22 about rotational axis 24 relative to lower housing 12B. Display 14 may be mounted in upper housing 12A. Upper housing 12A, which may sometimes referred to as a display housing or lid, may be placed in a closed position by rotating upper housing 12A towards lower housing 12B about rotational axis 24.

Figure 2:
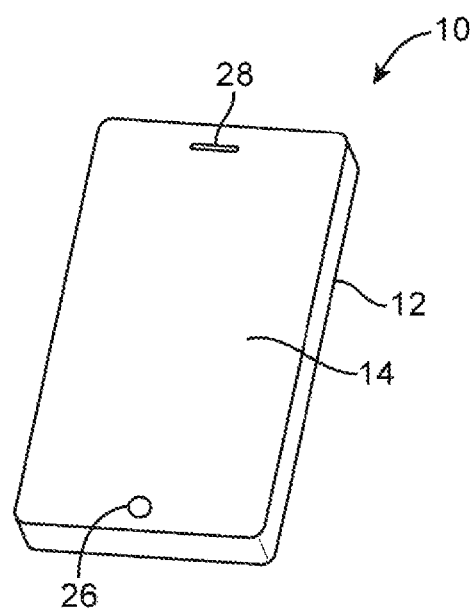
FIG. 2 is a perspective view of an illustrative electronic device such as a handheld electronic device with a display in accordance with an embodiment of the present invention.

FIG. 2 shows how electronic device 10 may be a handheld device such as a cellular telephone, music player gaming device, navigation unit, or other compact device. In this type of configuration for device 10, housing 12 may have opposing front and rear surfaces. Display 14 may be mounted on a front face of housing 12. Display 14 may, if desired, have openings for components such as button 26. Openings may also be formed in display 14 to accommodate a speaker port (see, e.g., speaker port 28 of FIG. 2).

Figure 3:
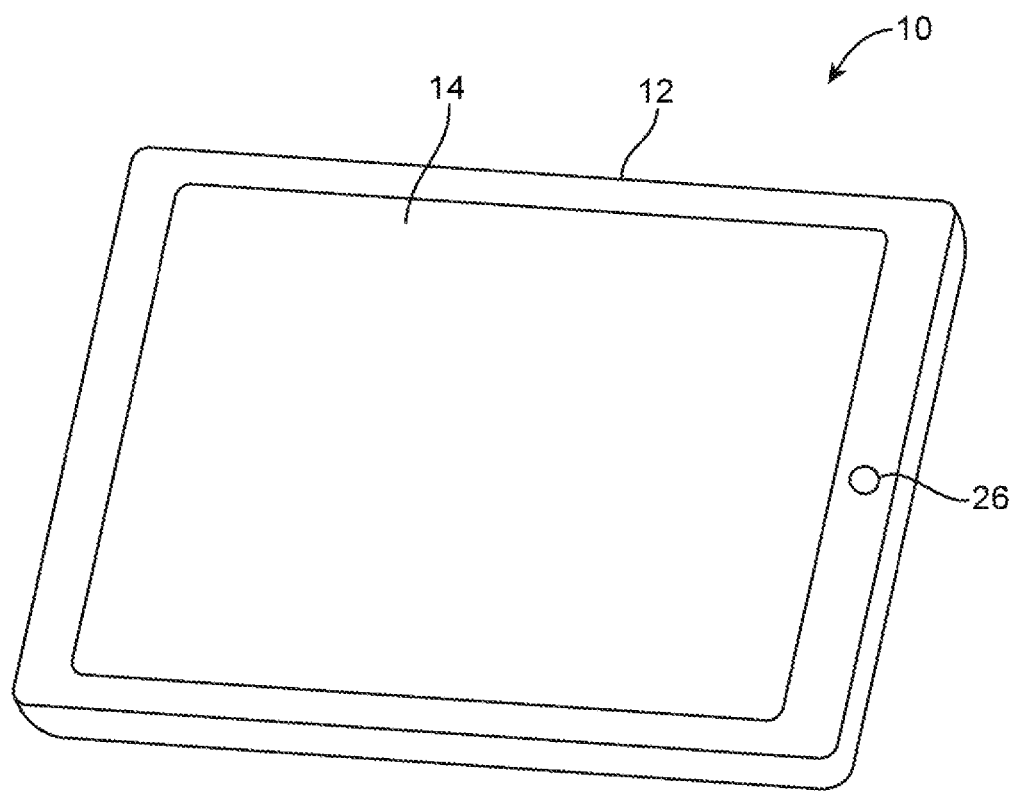
FIG. 3 is a perspective view of an illustrative electronic device such as a tablet computer with a display in accordance with an embodiment of the present invention.

FIG. 3 shows how electronic device 10 may be a tablet computer. In electronic device 10 of FIG. 3, housing 12 may have opposing planar from and rear surfaces. Display 14 may be mounted on the front surface of housing 12. As shown in FIG. 3, the front face of housing 12 may have an opening to accommodate button 26 (as an example).

Figure 4:
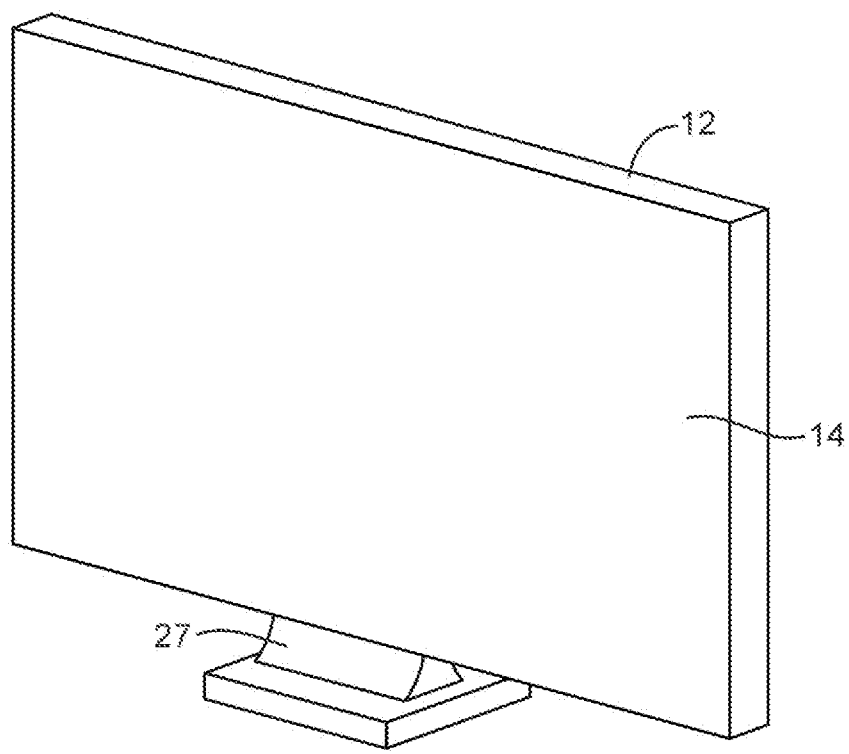
FIG. 4 is a perspective view of an illustrative electronic device such as a computer display with display structures in accordance with an embodiment of the present invention.

FIG. 4 shows how electronic device 10 may be a computer display or a computer that has been integrated into a computer display. With this type of arrangement, housing 12 for device 10 may be mounted on a support structure such as stand 27. Display 14 may be mounted on a front face of housing 12.

The illustrative configurations for device 10 that are shown in FIGS. 1, 2, 3, and 4 are merely illustrative. In general, electronic device 10 may be a laptop computer, a computer monitor containing an embedded computer, a computer display that does not contain an embedded computer, a tablet computer, a cellular telephone, a media player, or other handheld or portable electronic device, a smaller device such as a wrist-watch device, a pendant device, a headphone or earpiece device, or other wearable or miniature device, a television, a gaming device, a navigation device, an embedded system such as a system in which electronic equipment with a display is mounted in a kiosk or automobile, equipment that implements the functionality of two or more of these devices, or other electronic equipment.

Housing 12 of device 10, which is sometimes referred to as a case, may be formed of materials such as plastic, glass, ceramics, carbon-fiber composites and other fiber-based composites, metal (e.g., machined aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies or other suitable touch sensor components.

Display 14 for device 10 may include display pixels formed from liquid crystal display (LCD) components or other suitable image pixel structures. A display over layer may cover the surface of display 14 or a display layer such as a color filter layer or other portion of a display may be used as the outermost (or nearly outermost) layer in display 14. The outermost display layer may be formed from a transparent glass sheet, a clear plastic layer, or other transparent member.

Figure 5:
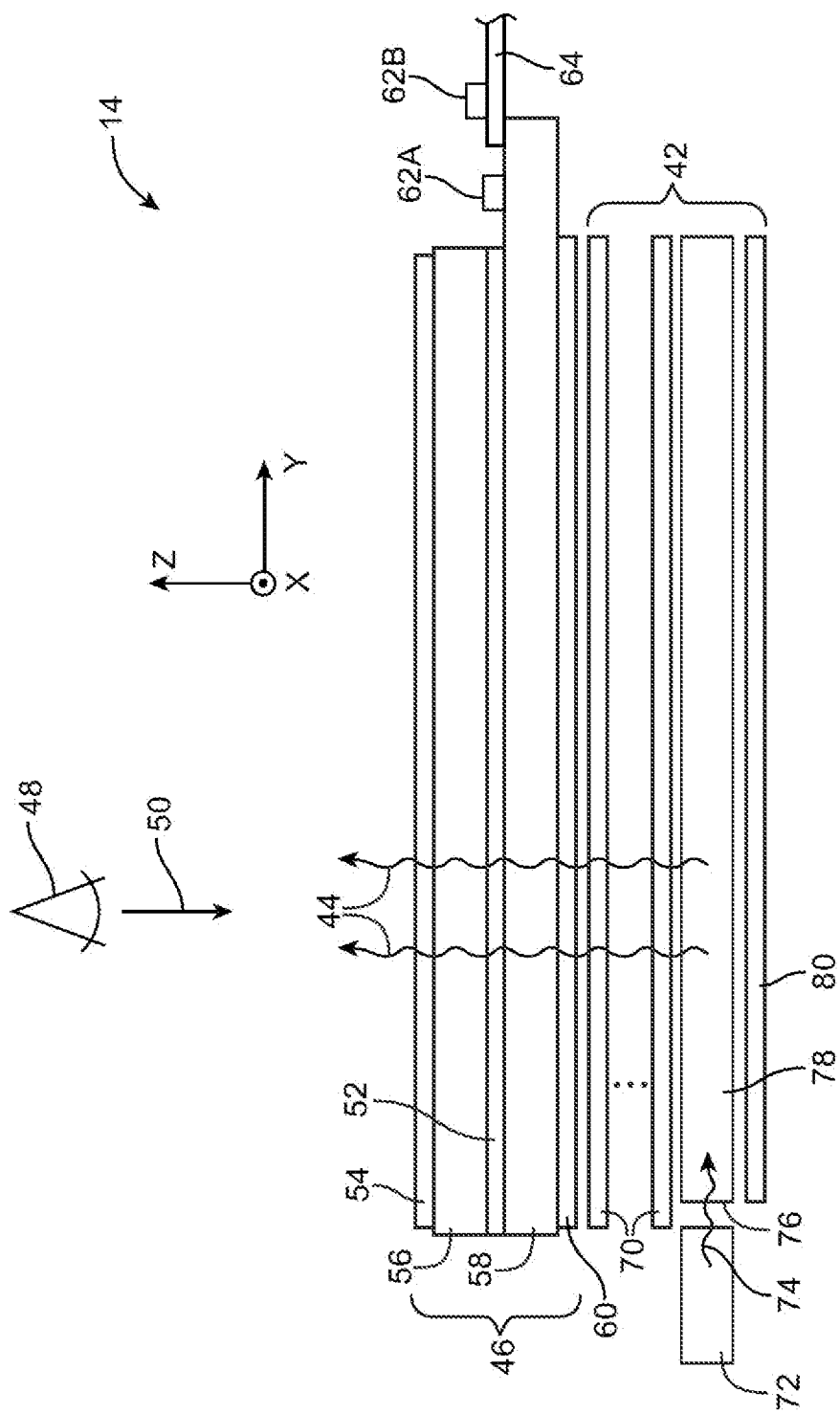
FIG. 5 is a cross-sectional side view of an illustrative display in accordance with an embodiment of the present invention.

A cross-sectional side view of an illustrative configuration for display 14 of device 10 (e.g., for display 14 of the devices of FIG. 1, FIG. 2, FIG. 3, FIG. 4 or other suitable electronic devices) is shown in FIG. 5. As shown in FIG. 5, display 14 may include backlight structures such as backlight unit 42 for producing backlight 44. During operation, backlight 44 travels outwards (vertically upwards in dimension Z in the orientation of FIG. 5) and passes through display pixel structures in display layers 46. This illuminates any images that are being produced by the display pixels for viewing by a user. For example, backlight 44 may illuminate images on display layers 46 that are being viewed by viewer 48 in direction 50.

Display layers 46 may be mounted in chassis structures such as a plastic chassis structure and/or a metal chassis structure to form a display module for mounting in housing 12 display layers 46 may be mounted directly in housing 12 (e.g., by stacking display layers 46 into a recessed portion in housing 12). Display layers 46 may form a liquid crystal display or may be used in forming displays of other types.

In a configuration in which display layers 46 are used in forming a liquid crystal display, display layers 46 may include a liquid crystal layer such a liquid crystal layer 52. Liquid crystal layer 52 may be sandwiched between display layers such as display layers 58 and 56. Layers 56 and 58 may be interposed between lower polarizer layer 60 and upper polarizer layer 54.

Layers 58 and 56 may be formed from transparent substrate layers such as clear layers of glass or plastic. Layers 56 and 58 may be layers such as a thin-film transistor layer and/or color filter layer. Conductive traces, color filter elements, transistors, and other circuits and structures may be formed on the substrates of layers 58 and 56 (e.g., to form a thin-film transistor layer and/or a color filter layer). Touch sensor electrodes may also be incorporated into layers such as layers 58 and 56 and/or touch sensor electrodes may be formed on other substrates.

With one illustrative configuration, layer 58 may be a thin-film transistor layer that includes an array of thin-film transistors and associated electrodes (display pixel electrodes) for applying electric fields to liquid crystal layer 52 and thereby displaying images on display 14. Layer 56 may be a color filter layer that includes an array of color filter elements for providing display 14 with the ability to display color images. If desired, layer 58 may be a color filter layer and layer 56 may be a thin-film transistor layer.

During operation of display 14 in device 10, control circuitry (e.g., one or more integrated circuits on a printed circuit) may be used to generate information to be displayed on display 14 (e.g., display data). The information to be displayed may be conveyed to a display driver integrated circuit such as circuit 62A or 62B using a signal path such as a signal path formed from conductive metal traces in a rigid or flexible printed circuit such as printed circuit 64 (as an example).

Backlight structures 42 may include a light guide plate such as light guide plate 78. Light guide plate 78 may be formed from a transparent material such as clear glass or plastic. During operation of backlight structures 42, a light source such as light source 72 may generate light 74. Light source 72 may be, for example, an array of light-emitting diodes.

Light 74 from light source 72 may be coupled into edge surface 76 of light guide plate 78 and may be distributed in dimensions X and Y throughout light guide plate 78 due to the principal of total internal reflection. Light guide plate 78 may include light-scattering features such as pits or bumps. The light-scattering features may be located on an upper surface and/or on an opposing lower surface of light guide plate 78.

Light 74 that scatters upwards in direction Z from light guide plate 78 may serve as backlight 44 for display 14. Light 74 that scatters downwards may be reflected back in the upwards direction by reflector 80. Reflector 80 may be formed from a reflective material such as a layer of white plastic or other shiny materials.

To enhance backlight performance for backlight structures 42, backlight structures 42 may include optical films 70. Optical films 70 may include diffuser layers for helping to homogenize backlight 44 and thereby reduce hotspots, compensation films for enhancing off-axis viewing, and brightness enhancement films (also sometimes referred to as turning films) for collimating backlight 44. Optical films 70 may overlap the other structures in backlight unit 42 such as light guide plate 78 and reflector 80. For example, if light guide plate 78 has a rectangular footprint in the X-Y plane of FIG. 5, optical films 70 and reflector 80 may have a matching rectangular footprint.

Figure 6:
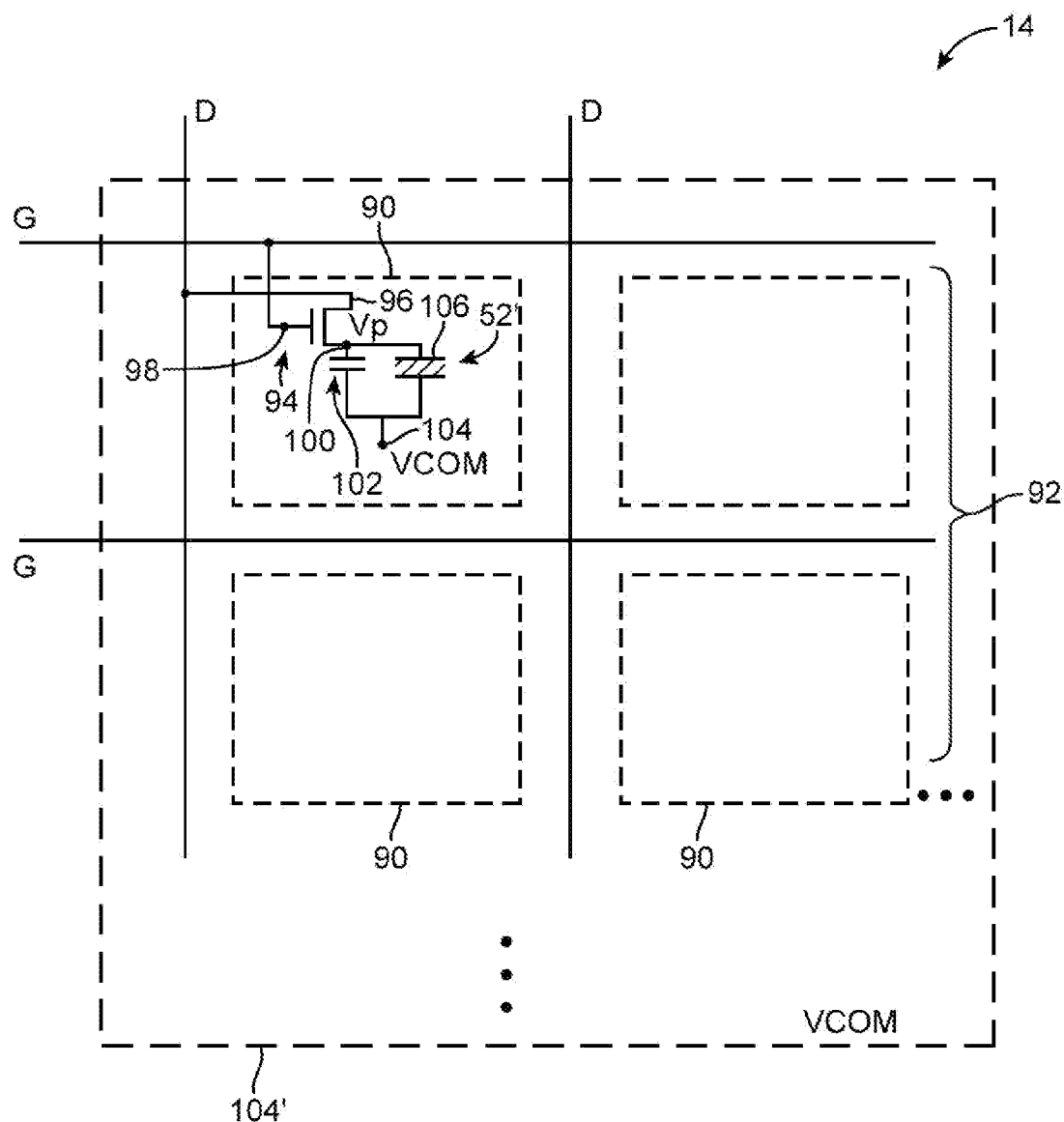
FIG. 6 is a top view of an array of display pixels in a display in accordance with an embodiment of the present invention.

As shown in FIG. 6, display 14 may include a pixel array such as pixel array 92. Pixel array 92 may be controlled using control signals produced by display driver circuitry. Display driver circuitry may be implemented using one or more integrated circuits (ICs) and may sometimes be referred to as a driver display driver integrated circuit, or display driver.

During operation of device 10, control circuitry in device 10 such as memory circuits, microprocessors, and other storage and processing circuitry may provide data to the display driver circuitry. The display driven circuitry may convert the data into signals for controlling the pixels of pixel array 92.

Pixel array 92 may contain rows and columns of display pixels 90. The circuitry of pixel array 92 may be controlled using signals such as data line signals on data lines D and gate line signals on gate lines G.

Pixels 90 in pixel array 92 may contain thin-film transistor circuitry (e.g., polysilicon transistor circuitry or amorphous silicon transistor circuitry) and associated structures for producing electric fields across liquid crystal layer 52 in display 14. Each display pixel 90 may have a respective thin-film transistor such as thin-film transistor 94 to control the application of electric fields to a respective pixel-sized portion 52' of liquid crystal layer 52.

The thin-film transistor structures that are used in forming pixels 90 may be formed on a thin-film transistor substrate such as a layer of glass. The thin-film transistor substrate and the structures of display pixels 90 that are firmed on the surface of the thin-film transistor substrate collectively form thin-film transistor layer 58 (FIG. 5).

Gate driver circuitry may be used to generate gate signals on gate lines G. The gate driver circuitry may be formed from thin-film transistors on the thin-film transistor layer or may be implemented in separate integrated circuits. Gate driver circuitry may be located on both the left and right sides of pixel array 92 or on one side of pixel array 92 (as examples).

The data line signals on data lines D in pixel array 92 carry analog image data (e.g., voltages with magnitudes representing pixel brightness levels). During the process of displaying images on display 14, a display driver integrated circuit may receive digital data from control circuitry and may produce corresponding analog data signals. The analog data signals may be demultiplexed and provided to data lines D. The data line signals on data lines D are distributed to the columns of display pixels 90 in pixel array 92. Gate line signals on gate lines G are provided to the rows of pixels 90 in pixel array 92 by associated gate driver circuitry.

The circuitry of display 14 such as demultiplexer circuitry, gate driver circuitry, and the circuitry of pixels 90 may be formed from conductive structures (e.g., metal lines and/or structures formed from transparent conductive materials such as indium tin oxide) and may include transistors such as transistor 94 that are fabricated on the thin-film transistor substrate layer of display 14. The thin-film transistors may be for example, polysilicon thin-film transistors or amorphous silicon transistors.

As shown in FIG. 6, pixels such as pixel 90 may be located at the intersection of each gate line G and data line D in array 92. A data signal on each data line D may be supplied to terminal 96 from one of data lines D. Thin-film transistor 94 (e.g., a thin-film polysilicon transistor or an amorphous silicon transistor) may have a gate terminal such as gate 98 that receives gate line control signals on gate line signal path G. When a gate line control signal is asserted, transistor 94 will be turned on and the data signal at terminal 96 will be passed to node 100 as voltage Vp. Data for display 14 may be displayed in frames. Following assertion of the gate line signal in each row to pass data signals to the pixels of that row, the gate line signal may be deasserted. In a subsequent display frame, the gate line signal for each row may again be asserted to turn on transistor 94 and capture new values of Vp.

Pixel 90 may have a signal storage element such as capacitor 102 or other charge storage element. Storage capacitor 102 may be used to store signal Vp in pixel 90 between frames (i.e., in the period of time between the assertion of successive gate signals).

Display 14 may have a common electrode coupled to node 104. The common electrode (which is sometimes referred to as the Vcom electrode) may be used to distribute a common electrode voltage such as common electrode voltage Vcom to nodes such as node 104 in each pixel 90 of array 92. As shown by illustrative electrode pattern 104 of FIG. 6, Vcom electrode 104 may be implemented using a blanket film of a transparent conductive material such as indium tin oxide (i.e., electrode 104 may be formed from a layer of indium tin oxide that covers all of pixels 90 in an array 92). In other suitable arrangements, the Vcom electrode may be formed in other patterns (e.g., in horizontal and vertical strips of indium tin oxide) to support capacitive touch sensor mechanisms.

In each pixel 90, capacitor 102 may be coupled between nodes 100 and 104. A parallel capacitance arises across nodes 100 and 104 due to electrode structures in pixel 90 that are used in controlling the electric field through the liquid crystal material of the pixel (liquid crystal material 52'). As shown in FIG. 6, electrode structures 106 may be coupled to node 100. The capacitance across liquid crystal material 52' is associated with the capacitance between electrode structures 106 and common electrode Vcom at node 104. During operation, electrode structures 106 may be used to apply a controlled electric field (i.e., a field having a magnitude proportional to the difference between Vp and Vcom) across pixel-sized liquid crystal material 52' in pixel 90. Due to the presence of storage capacitor 102 and the capacitance of liquid crystal material 52', the value of Vp and therefore the associated electric field across liquid crystal material 52') may be maintained across nodes 106 and 104 for the duration of the frame.

The electric field that is produced across liquid crystal material 52' causes a change in the orientations of the liquid crystals in liquid crystal material 52'. This changes the polarization of light passing through liquid crystal material 52'. The change in polarization may, in conjunction with polarizer's 60 and 54 of FIG. 4, be used in controlling the amount of light 44 that is transmitted through each pixel 90 in array 92 of display 14.

Figure 7:
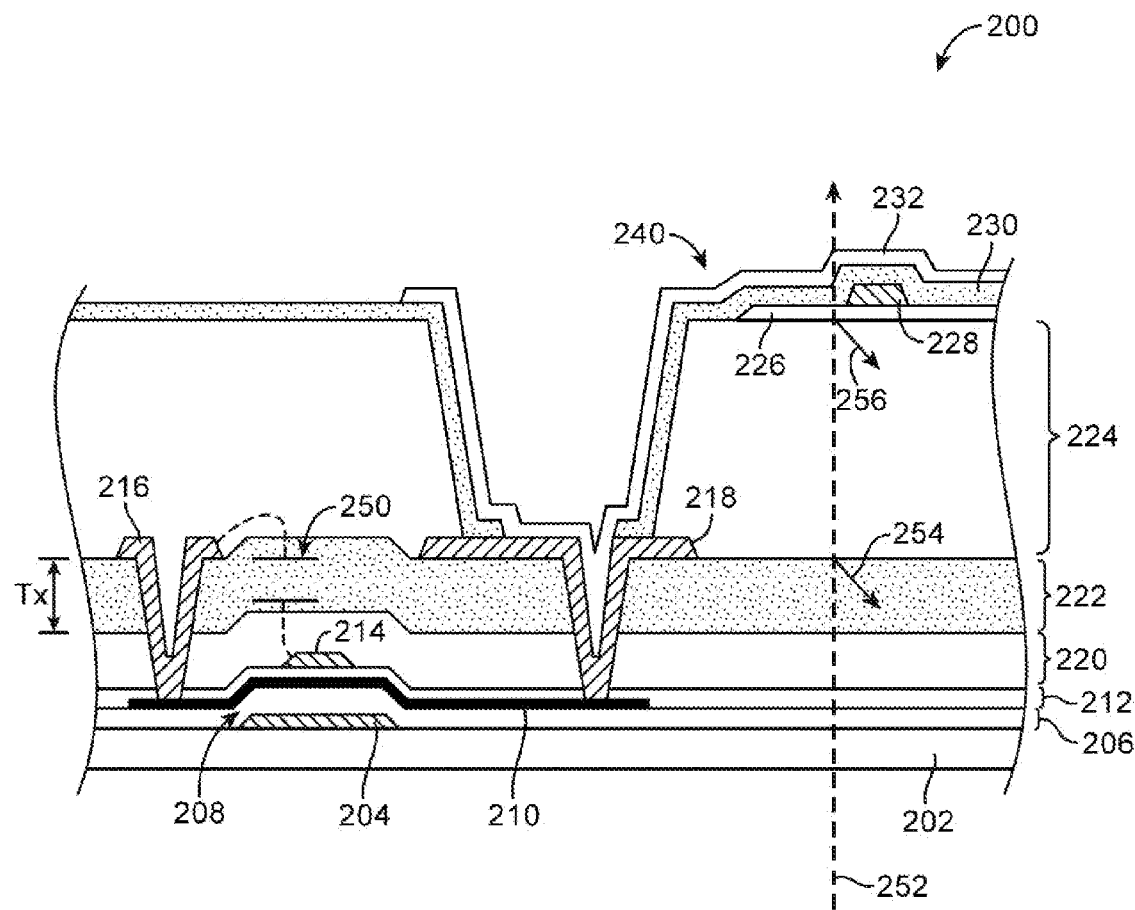
FIG. 7 is a cross-sectional side view of conventional display pixel structures.

FIG. 7 shows a cross-sectional side view of a conventional display pixel 200 that can be formed in the thin-film transistor layer of the display. As shown in FIG. 7, a thin-film transistor 208 is formed on a glass substrate 202. A metal light shield 204 is often formed on glass substrate 202 directly beneath thin-film transistor 208 to prevent backlight from potentially interfering with the operation of thin-film transistor 208.

One or more buffer layers 206 can then formed on glass substrate 202 over light shield 204. Polysilicon 210 is patterned on buffer layers 206 to form an active area for transistor 208. Gate insulating material 212 is formed on buffer layers 206 over polysilicon 210. A metal gate conductor 214 is formed on gate insulating layer 212 and serves as the gate terminal for transistor 208. A silicon nitride layer 220 is formed on gate insulating material 212 over gate 214.

A silicon oxide layer 222 is then formed on silicon nitride layer 220. Metal contact structures 216 and 218 are formed through layers 222, 220, and 212 to contact polysilicon 210. In the diagram of FIG. 7, the portion of polysilicon 210 that is coupled to contact 216 serves as a first source-drain terminal for transistor 208 that is coupled to a corresponding data line (i.e., contact 216 is connected to metal routing paths on which analog image data signals are provided), whereas the portion of polysilicon 210 that is coupled to contact 218 serves as a second source-drain terminal for transistor 208 that is coupled to a corresponding pixel node (i.e., contact 218 is connected to pixel electrode structures on which image data signals are temporarily stored).

An acrylic organic planarization layer 224 is formed on silicon oxide layer 222 A common electrode (Vcom) layer 226 is formed on planarization layer 224. A metal routing conductor 228 is formed on Vcom layer 226. An opening is formed in planarization layer 224 to form an electrical connection between contact 218 and a pixel electrode layer 232 (i.e., to form a display pixel contact). Insulating material 230 is interposed between pixel electrode layer 232 and common electrode layer 226. A display pixel storage capacitor 240 is formed from Vcom electrode 226 and a portion of pixel electrode 232 that overlaps with the Vcom electrode (i.e., Vcom layer 226 and the portion of pixel electrode layer 232 that directly faces Vcom layer 226 are separated by insulating material 230 and serve collectively as the storage capacitor for display pixel 200). Common electrode layer 226 and pixel electrode layer 232 are typically formed from indium tin oxide, a transparent material that allows backlight to pass through to the liquid crystal material above the thin-film transistor layer.

Conventional thin-film transistor and associated display pixel structures formed in the arrangement of FIG. 7 may suffer from reduced transmittance. For example, silicon oxide layer 222 may exhibit a refractive index of 1.46, whereas acrylic organic planarization layer 224 may exhibit a relatively higher refractive index of 1.51. Due to this difference in material and the indices of refraction, at least some backlight 252 that is being transmitted through the thin-film transistor layer will be reflected back into the display, as indicated by arrow 254 (i.e., a portion of the backlight striking the interface between the silicon oxide layer and the acrylic planarization layer will be reflected back towards the source). Indium tin oxide may exhibit a refractive index of 1.8. As a result, at least some of the light that is being transmitted through the interface between acrylic planarization layer 224 and the Vcom electrode layer 226 will be reflected back into the display due to the difference in the indices of refraction as indicated by arrow 256. Light reflected back towards the backlight source in this way substantially reduces the transmittance of the display.

Conventional display pixel structures of the type shown in FIG. 7 may also suffer from excessive data line capacitive loading at higher display resolutions. The parasitic capacitance between the data line routing 216 and the thin-film transistor gate conductor 214 (represented by capacitance 250 in FIG. 7) degrades the display pixel charging performance and increases display panel power consumption. In order to reduce this data line loading capacitance 250, the thickness Tx of silicon oxide layer 222 will have to be increased. However, thicker silicon oxide layers suffer from high film stress, which could potentially cause glass breakage in substrate 202 (i.e., thickness Tx of the silicon oxide layer is limited by mechanical reliability constraints, thereby limiting the amount by which thickness Tx of layer 222 can be increased). It would therefore be desirable to provide display pixel structures with improved transmittance and reduced data line loading.

Figure 8:
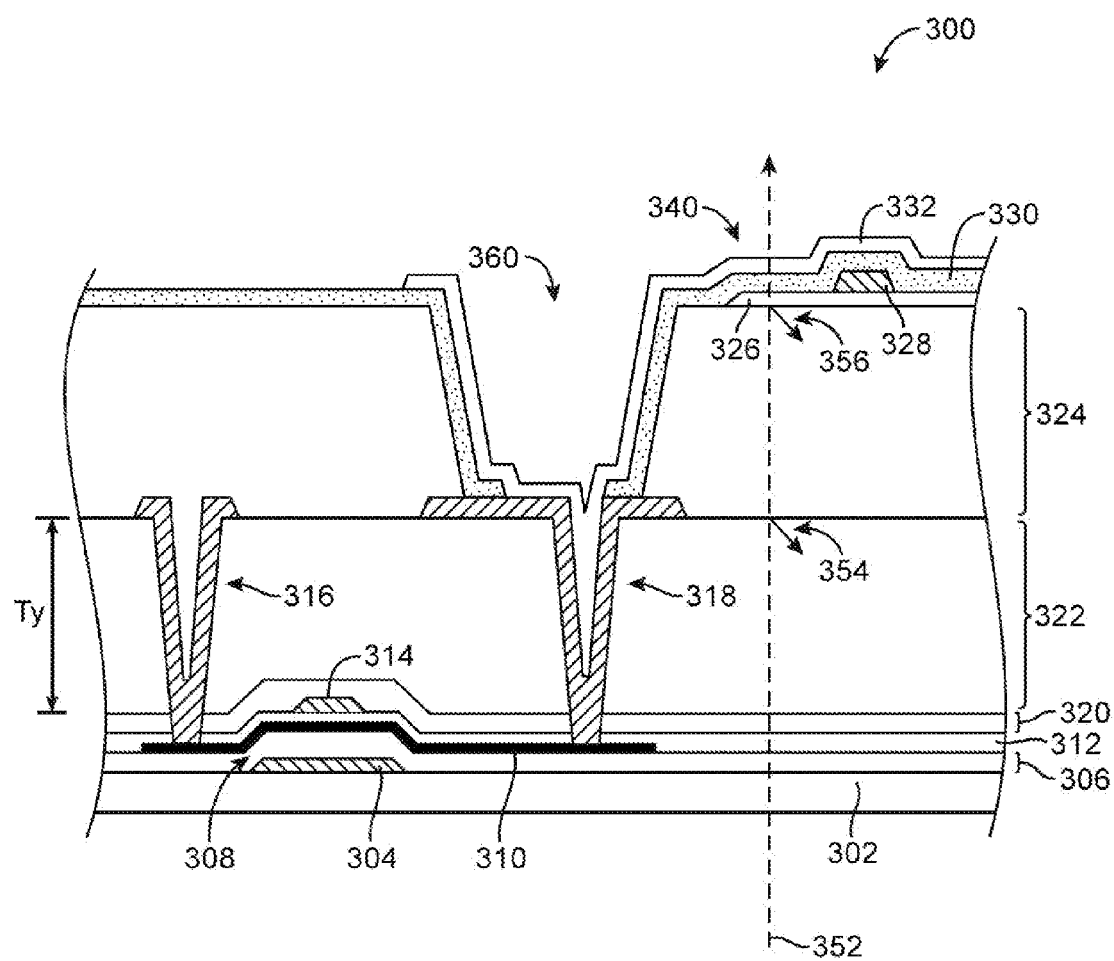
FIG. 8 is a cross-sectional side view of illustrative display pixel structure in accordance with an embodiment of the present invention.

In accordance with an embodiment of the present invention, a display pixel 300 exhibiting improved backlight transmittance and reduced data line loading compared to the conventional pixel 200 of FIG. 7 is provided (see, e.g., FIG. 8). As shown in FIG. 8, thin-film transistor structures such as thin-film transistor 308 may be formed on a transparent substrate 302 made from as glass or other dielectric material. Thin-film transistor 308 may serve as the display pixel thin-film transistor 94 that is described in connection with FIG. 6.

Light shielding structures such as light shield 304 may be formed on substrate 302 directly beneath transistor 308 and may serve to prevent backlight from interfering with the operation of transistor 94. One or more buffer layers such as buffer layers 306 may be formed on substrate 302 and over light shield 304. Buffer layers 306 may be formed from any suitable transparent dielectric material.

Active material 310 for transistor 94 may be formed on buffer layers 306. Active material 310 may be a layer of amorphous silicon or polysilicon (as examples). A gate insulating layer such as gate insulating layer 312 may be formed on buffer layers 306 and over the active material. A conductive gate structure such as gate conductor 314 may be disposed over gating insulator 312. Gate conductor 314 may serves as the gate terminal for thin-film transistor 308. The portion of active material 310 directly beneath gate 314 may serve as the channel region for transistor 308.

A passivation layer such as a silicon nitride layer 320 may be formed on gate insulating layer 312 and over gate 314. After deposition of layer 320, a hydrogenation annealing process may be applied to passivate transistor structures 308. The material with which gate 314 is formed is sometimes referred to as "M1" metal. As a result, layer 320 in which gate conductor 314 is formed may sometimes be referred to as a first metal (M1) routing layer.

A low-k dielectric layer 322 (e.g., a layer formed from dielectric material having a dielectric constant κ less than that of silicon dioxide may be formed on passivation layer 320. Layer 322 may be formed from acrylic, photoresist or other light-sensitive material, siloxane based polymer, silicon-based dielectric, organic material, a combination of these materials, and/or any suitable low-k dielectric materials.

Transistor source-drain contact structures such as structures 316 and 318 may be formed through layer 322 to make electrical contact with transistor active material 310. Contact structures 316 and 318 are sometimes referred to as "via" structures. In particular, the portion of active material 310 that makes contact with via 316 may serve as a first source-drain region for transistor 308, whereas the portion of active material 310 that makes contact with via 318 may serve as a second source-drain region for transistor 308. Thin-film transistors in which the gate conductor is formed above the active source-drain regions are generally referred to as "top-gate" thin-film transistors. This is merely illustrative. If desired, pixel 300 may be formed using "bottom-gate" thin-film transistor arrangements in which the gate conductor is formed below the active source-drain regions.

Metal routing structures sometimes referred to as "M2" metal routing paths may be formed on layer 322 to connect the transistor source-drain terminals to other display pixel circuitry. As an example, a first M2 metal routing path formed on layer 322 may be used to connect via 316 to a corresponding data line (e.g., data line D in FIG. 6), whereas a second M2 metal routing path formed on layer 322 may be used to connect via 318 to a corresponding pixel electrode node (see, e.g., node 100 on which pixel voltage Vp is stored in FIG. 6).

Another low-k dielectric layer such as layer 324 may be formed on layer 322. Layer 324 may serve as a planarization layer and may sometimes be referred to as a second metal (M2) routing layer. Similar to layer 322, layer 324 may be formed from acrylic, photoresist or other light-sensitive material, siloxane-based polymer, silicon-based dielectric, organic material, a combination of these materials, and/or any suitable low-k dielectric materials. In general, layers 322 and 324 should be formed from the same material or materials having substantially similar indices of refraction so as to maximize the transmittance of backlight propagating through these dielectric layers (e.g., the indices of refraction should differ by no more than 0.05, by no more than 0.01, etc.).

A common electrode layer such as Vcom layer 326 may be formed on low-k dielectric planarization layer 324. Common electrode layer 326 may be formed as a blanket film of transparent conductive material that covers the entirely of the display pixel array, as separate Vcom regions interconnected by additional routing paths, or in other patterns (e.g., in horizontal and vertical strips of transparent conductive material) that support capacitive touch sensing technologies. Additional Vcom routing structures 328 (sometimes referred to as "M3" metal coming paths) may be formed on Vcom layer 326 to connect the Vcom electrode to other display circuitry (e.g., to interconnect different Vcom layers, to connect the Vcom layer to associated Vcom driver circuitry, to connect the Vcom layer to touch sensor circuitry, etc.).

An opening may be formed in planarization layer 324 to form an electrical connection between via 318 and a pixel electrode layer 332 to form a display pixel contact 360 (e.g., a contact that connects the storage capacitor to thin-film transistor 308). Pixel electrode layer 332 may be patterned to form finger-shaped electrodes (not shown in FIG. 8). Insulating material 330 may be formed between pixel electrode layer 332 and common electrode layer 326. Vcom electrode 326 and a portion of pixel electrode 332 that overlaps with Vcom electrode 326 may form storage capacitor 340 (e.g., the storage capacitor may include Vcom layer 326, the portion of pixel electrode layer 332 that directly faces Vcom layer 326, and insulating material 330 interposed between the two opposing parallel conductors). In the example of FIG. 8, pixel contact 360 is formed directly over the second source-drain region of thin-film transistor 308.

In general, common electrode 326 and pixel electrode 332 may be formed from indium tin oxide or other suitable transparent material that allows backlight to pass through to the liquid crystal material above the thin-film transistor layer. Light shielding structures 304, via structures 316 and 318, the M1 gate structures, and the M2 and M3 metal routing paths may be formed from copper, aluminum, silver, gold, tungsten, nickel, other metals, a combination of these materials, and/or other conductive material suitable for routing data and control signals in display 14.

Display pixel structures 300 of the type shown in FIG. 8 may exhibit improved transmittance and performance relative to that of the conventional pixel 200 of FIG. 7. Consider an example in which layers 322 and 324 are formed from the same material having a refractive index of 1.55. Since there is no difference in the refractive index between layers 322 and 324, backlight 352 that is being transmitted through the thin-film transistor layer will experience minimal reflection 354 at the interface between layers 322 and 324. As described above, the Vcom electrode 326 formed on top of layer 324 may be formed from indium tin oxide, which may exhibit a refractive index of 1.8. As a result, at least some of light 352 that is being transmitted through the interface between planarization layer 324 and the Vcom electrode layer 326 will be reflected back into the display due to the difference in the indices of refraction, as indicated by arrow 356. If desired, layers 322 and 324 may be formed using low-k dielectric material having similar refractive indices as the material used to form Vcom electrode 326 and pixel electrode 332.

Consider another example in which layers 322 and 324 are formed from different materials having similar indices of refraction. For example, layer 322 may be formed from low-k dielectric material exhibiting an index of refraction of 1.55, whereas layer 324 may be formed from low-k dielectric material exhibiting an index of refraction of 1.54. The Vcom electrode layer 326 may be formed from transparent conductive material having an index of refraction 1.56. Since there is a negligible amount of difference in the refractive indices between layers 322 and 324 and between layers 324 and 326, backlight 352 will experience minimal reflections at the interfaces among these layers. As a result, the transmittance of display 14 is improved.

The use of low-k dielectric material in layer 322 instead of silicon oxide substantially reduces the data line capacitive loading between the M2 routing paths and the M1 gate structures. Moreover, the thickness Ty of layer 322 cart be increased without suffering from high film stress, which also reduces the data line loading (i.e., the thickness Ty of layer 322 may be greater than the thickness Tx of silicon oxide layer 222). In some embodiments, the interlayer dielectric (ILD) capacitance between the M2 metal and M1 metal can be reduced by 70-80%, which can significantly improve display performance and reduce power consumption. The use of low-k dielectric material in layer 324 can also help reduce the ILD capacitance between the M3 and M2 metal routing paths. Layers 322 and 324 may be formed using dielectric material with a dielectric constant of 3.1 (as an example).

Figure 9:
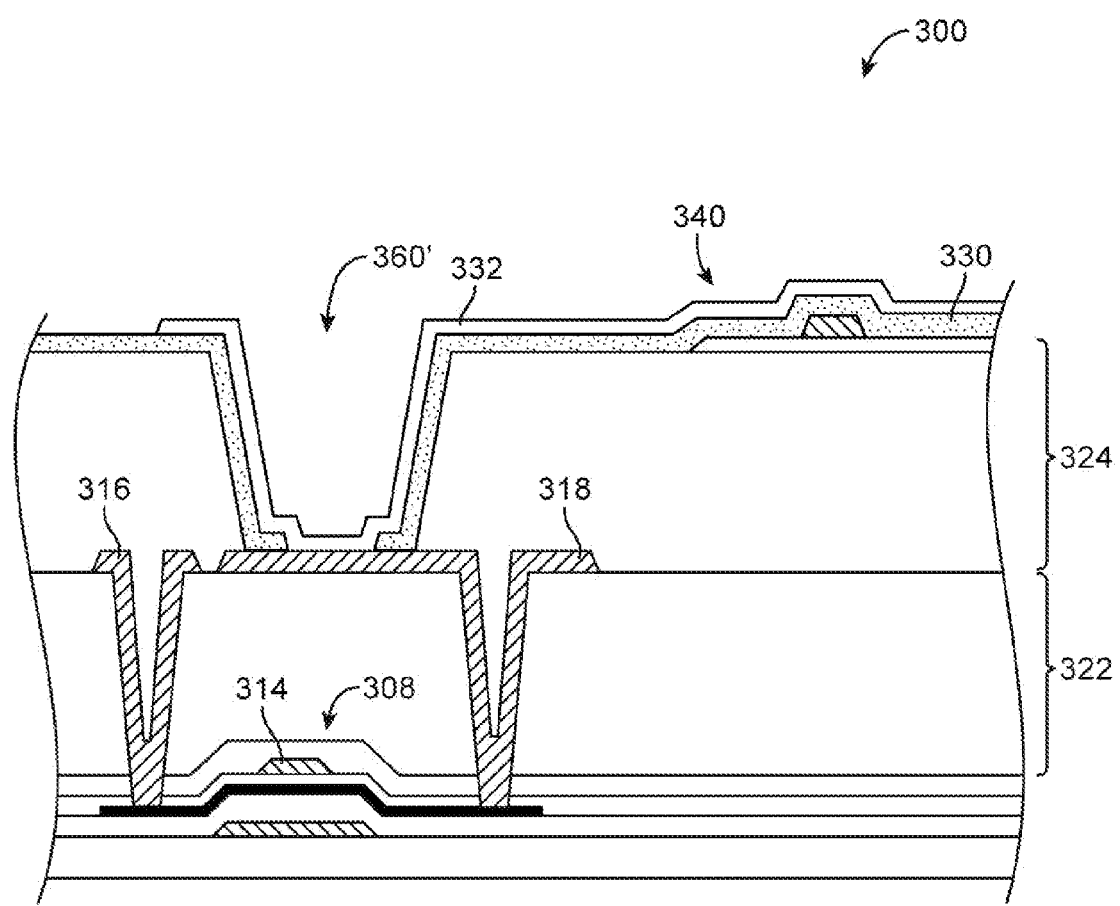
FIG. 9 is a cross-sectional side view of illustrative display pixel structures having a pixel contact formed directly over a thin-film transistor gate structure in accordance with an embodiment of the present invention.

By lowering the ILD capacitance between the M1 and M2 metal routing structures via the use of a thicker low-k dielectric layer, the pixel contact location 360' can be shifted directly over the M1 gate line 314 without substantially increasing the capacitance between the gate line and the pixel electrode (see, e.g., FIG. 9, where the pixel contact, metal crosses over gate 314). The ability to route M1 and M2 metal closer to one other can help improve an aperture ratio of each display pixel. The aperture ratio of a display pixel may be defined by the amount of transparent area of the pixel relative to the amount of opaque area associated with opaque transistor structures, metal lines, etc. Improving the aperture ratio can help increase display resolution and efficiency.

Figure 10:
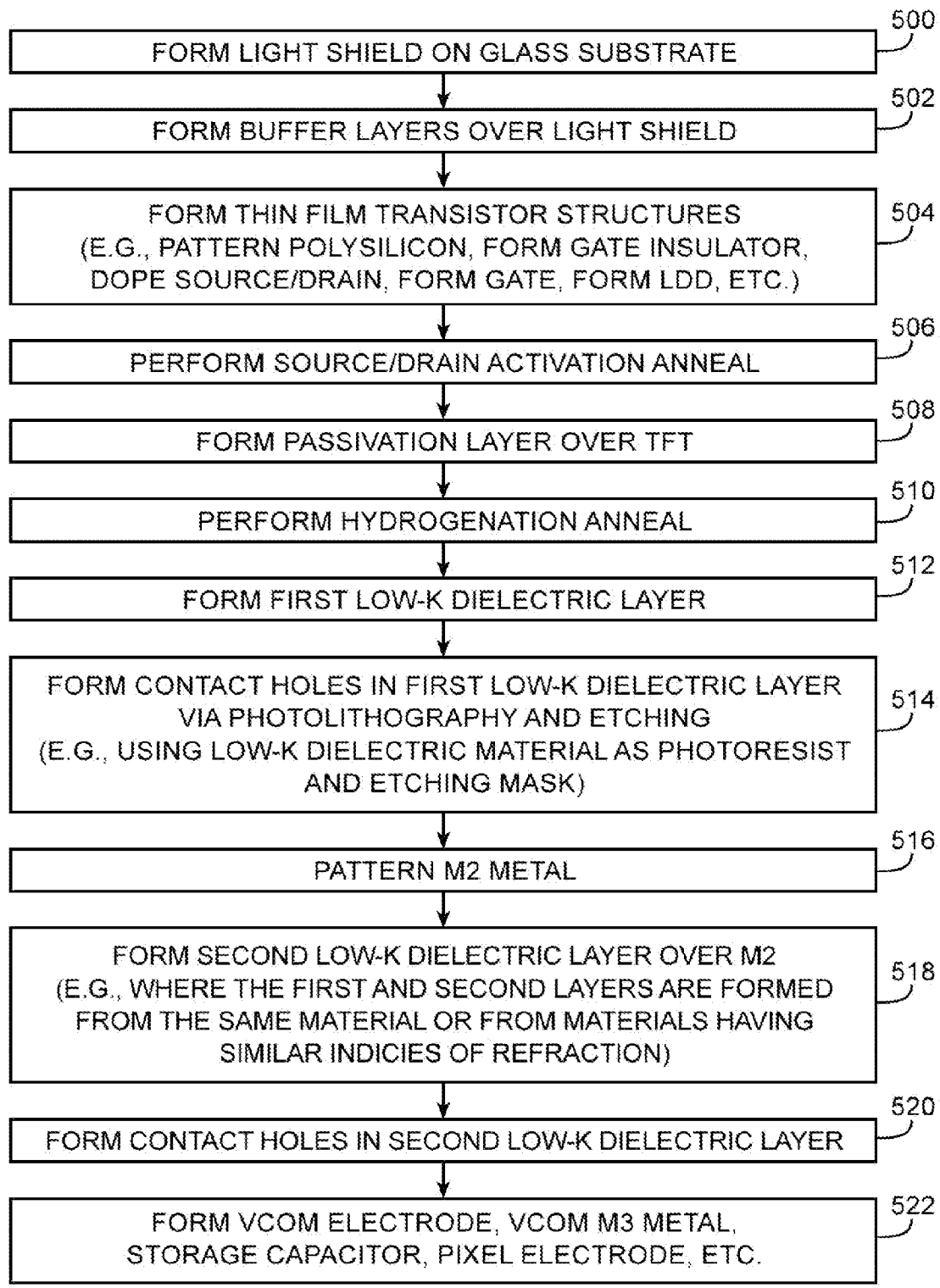
FIG. 10 is a flow chart of illustrative steps involved in forming the display pixel structures of FIGS. 8 and 9 in accordance with an embodiment of the present invention.

FIG. 10 shows a flow chart of illustrative steps involved in forming a display pixel of the type described in connection with FIGS. 8 and 9. At step 500, an opaque light shield structure 304 may be formed on substrate 302. At step 502, one or more buffer layers 306 may be formed on substrate 302 over light shield 304.

At step 504, thin-film transistor structures 308 may be formed on buffer layers 306 (e.g., active area polysilicon material and associated source-drain doping and lightly-doped drain (LED) regions, gate insulating layer, and gate structures can be formed). At step 506, an annealing process may be performed to activate the source-drain regions (e.g., to help the source-drain dopants diffuse appropriately in material 310).

At step 508, a passivation layer 320 (e.g., a silicon nitride layer) may be formed over the thin-film transistor structures 308. At step 510, a hydrogenation annealing process may be performed to actually passivate the thin-film transistor 308 with layer 320.

At step 512, a first low-k dielectric, layer 322 may be formed on passivation layer 320. At step 514, contact holes may be formed in the first low-k dielectric layer 322 via photolithography and etching processes. In some arrangements, layer 322 may be formed from light-sensitive material and may be used like photoresist that is exposed and developed to form the desired contact holes. Layer 322 may also serve as an etching mask when etching away the passivation layer and the gate insulating layer during formation of the contact holes (e.g., layer 322 may also be formed using etch-resistant material).

At step 516, M2 metal routing structures may be patterned on layer 322 (e.g., data line routing structures and pixel node routing structures may be formed on layer 322).

At step 518, a second low-k dielectric layer 324 may be formed on the first low-k dielectric layer 322 over the M2 metal routing structures. In one arrangement, the first and second low-k dielectric layers may be formed from the same low-k dielectric material. In other arrangements, the first and second low-k dielectric layers may be formed from different low-k dielectric material having substantially similar refractive indices.

At step 520, contact holes may be formed in the second low-k dielectric layer 324 via photolithography and etching processes (e.g., layer 324 may also be formed from photoresist and etch resistant materials). At step 522, the Vcom electrode 326, M3 metal routing structures 328, storage capacitor, pixel electrode 332, and other display pixel structures may be formed.

The steps of FIG. 10 are merely illustrative and do not serve to limit the scope of the present invention. In general, an array of display pixels may be formed in this way. Although the methods of manufacture were described in a specific order, it should be understood that other steps may be performed in between described operations, described operations may be adjusted so that they occur at slightly different times, etc.

The foregoing is merely illustrative of the principles of this invention and various modifications can be made by those skilled in the art without departing from the scope and spirit of the invention. The foregoing embodiments may be implemented individually or in any combination.

What is claimed is:

1. Display pixel circuitry, comprising:
    a substrate;
    a thin-film transistor formed on the substrate, wherein the thin-film transistor has a source terminal, a drain terminal, and a gate conductor that is formed between the source and drain terminals;
    a first dielectric layer formed over the thin-film transistor;
    a second dielectric layer formed on the first dielectric layer, wherein the first and second dielectric layers have indices of refraction that are within ten percent of each other;
    a pixel electrode that makes contact with the drain terminal of the thin-film transistor at a location positioned directly above the gate conductor of the thin-film transistor, wherein the pixel electrode is formed from a conductive material; and
    a common electrode that is formed from the conductive material.

2. The display pixel circuitry defined in claim 1, wherein the first and second dielectric layers are formed from identical dielectric material.

3. The display pixel circuitry defined in claim 1, wherein the first and second dielectric layers are formed from different dielectric materials having dielectric constants less than that of silicon dioxide.

4. The display pixel circuitry defined in claim 1, wherein the first dielectric layer is formed from low-k dielectric material.

5. The display pixel circuitry defined in claim 4, wherein the second dielectric layer is formed from low-k dielectric material.

6. The display pixel circuitry defined in claim 1, wherein the first dielectric layer comprises photoresist.

7. The display pixel circuitry defined in claim 1, further comprising:
    a passivation layer interposed between the thin-film transistor structures and the first dielectric layer.

8. The display pixel circuitry defined in claim 1, wherein the common electrode is formed on the second dielectric layer, wherein the pixel electrode is formed at least partially over the common electrode, and wherein the common electrode and a portion of the pixel electrode that is partially formed over the common electrode serve as a storage capacitor for the display pixel circuitry.

9. A method of manufacturing display pixel circuitry, comprising:
    forming a top-gate thin-film transistor on a substrate, wherein the thin-film transistor includes a gate conductor and a source-drain region;
    forming a first low-k dielectric layer on a passivation layer;
    forming a second low-k dielectric layer on the first low-k dielectric layer;

forming a first via through the first low-k dielectric layer, wherein the first via makes contact with the source-drain region of the thin-film transistor;

forming a common electrode using a transparent material; and forming a second via through the second low-k dielectric layer, wherein the second via contacts the first via at a location directly over the gate conductor of the thin-film transistor.

10. The method defined in claim 9, wherein the first low-k dielectric layer has a dielectric constant less than that of silicon dioxide.

11. The method defined in claim 9, wherein the first low-k dielectric layer and the second low-k dielectric layer have refractive indices that are within ten percent of each other.

12. The method defined in claim 11, further comprising:
forming a storage capacitor for the display pixel circuitry on the second low-k dielectric layer.

13. The method defined in claim 9, further comprising:
forming a passivation layer directly on the gate conductor of the thin-film transistor.

14. Display pixel structures, comprising:
a substrate;
a thin-film transistor formed over the substrate, wherein the thin-film transistor includes a first source-drain terminal, and a second source-drain terminal, and a gate terminal formed between the first and second source-drain terminals;
a first low-k dielectric layer formed over the thin-film transistor;
a second low-k dielectric layer formed on the first low-k dielectric layer; and
a storage capacitor formed from a pixel electrode and a common electrode, wherein the pixel electrode makes contact with the first source-drain terminal at a pixel contact location positioned directly over the gate terminal of the thin-film transistor, wherein the pixel electrode is formed through the second low-k dielectric layer, and wherein the common electrode and the thin-film transistor are non-overlapping when viewed from above.

15. The display pixel structures defined in claim 14, further comprising:
a first low-k dielectric layer formed over the thin-film transistor; and
data line routing structures that are formed on the first low-k dielectric layer and that are coupled to the second source-drain terminal.

16. The display pixel structures defined in claim 15, further comprising:
a second low-k dielectric layer formed on the first low-k dielectric layer, wherein the first and second low-k dielectric layers exhibit substantially similar indices of refraction that differ by less than 0.05.

17. The display pixel structures defined in claim 16, wherein the first and second low-k dielectric layers are formed from light-sensitive photoresist material and etch resistant material.

18. The display pixel structures defined in claim 15, further comprising:
a passivation layer interposed between the first low-k dielectric layer and the gate terminal of the thin-film transistor.

* * * * *

UNITED STATES PATENT AND TRADEMARK OFFICE
CERTIFICATE OF CORRECTION

PATENT NO. : 9,530,801 B2  Page 1 of 1
APPLICATION NO. : 14/153954
DATED : December 27, 2016
INVENTOR(S) : Daisuke Nozu et al.

It is certified that error appears in the above-identified patent and that said Letters Patent is hereby corrected as shown below:

In the Claims

In Claim 7, Column 12, Line 51, delete "structures".

In Claim 15, Column 14, Lines 12-13, delete "a first low-k dielectric layer formed over the thin-film transistor; and".

In Claim 16, Column 14, Lines 18-20, delete "further comprising: a second low-k dielectric layer formed on the first low-k dielectric layer,".

Signed and Sealed this
Twentieth Day of June, 2017

Joseph Matal
*Performing the Functions and Duties of the*
*Under Secretary of Commerce for Intellectual Property and*
*Director of the United States Patent and Trademark Office*